US009353557B2

(12) United States Patent
Sanborn et al.

(10) Patent No.: US 9,353,557 B2
(45) Date of Patent: May 31, 2016

(54) DOOR HANDLE ARRANGEMENT FOR VEHICLES

(71) Applicant: Huf North America Automotive Parts Manufacturing Corp., Milwaukee, WI (US)

(72) Inventors: James Sanborn, Hudson, MI (US); Robert Campbell, Farmington, MI (US)

(73) Assignee: Huf North America Automotive Parts Manufacturing Corp., Milwaukee, WI (US)

( * ) Notice: Subject to any disclaimer, the term of this patent is extended or adjusted under 35 U.S.C. 154(b) by 10 days.

(21) Appl. No.: 14/145,365

(22) Filed: Dec. 31, 2013

(65) Prior Publication Data

US 2014/0367975 A1    Dec. 18, 2014

Related U.S. Application Data

(60) Provisional application No. 61/834,243, filed on Jun. 12, 2013.

(51) Int. Cl.
*E05B 3/00* (2006.01)
*E05B 85/14* (2014.01)
(Continued)

(52) U.S. Cl.
CPC .............. *E05B 85/14* (2013.01); *E05B 81/76* (2013.01); *E05B 81/77* (2013.01); *E05B 81/78* (2013.01);
(Continued)

(58) Field of Classification Search
CPC .......... E05B 81/76; E05B 81/77; E05B 81/78
USPC .................. 292/336.3; 200/302.1, 302.2, 306
See application file for complete search history.

(56) References Cited

U.S. PATENT DOCUMENTS 3,932,722 A * 1/1976 Obata ................... H01H 13/702
                                                   200/302.2
4,441,001 A * 4/1984 Miyano ................. H01H 13/702
                                                   200/292
(Continued)

FOREIGN PATENT DOCUMENTS

DE          10212768 A1 *  6/2003  ............. E05B 65/20
DE          10212794 A1 *  6/2003  ............. B29C 45/14
(Continued)

OTHER PUBLICATIONS

PCT International Search Report and Written Opinion, PCT/US2014/041645, Sep. 16, 2014, 10 pages.
(Continued)

*Primary Examiner* — Carlos Lugo
(74) *Attorney, Agent, or Firm* — Honigman Miller Schwartz and Cohn LLP; Matthew H. Szalach; Jonathan P. O'Brien

(57) ABSTRACT

A door handle arrangement for vehicles including an electrically insulating cover having an outer actuating surface for a user characterized by at least one metal actuating electrode disposed on the inner side of the cover that is on the side of the cover facing away from the actuating surface. The cover is elastically deformable by an actuation in the area of the actuating surface. The arrangement includes at least one sensor electrode that is disposed at a distance from the actuating element and opposite the inner side of the cover, wherein the sensor electrode lies opposite the actuating electrode at least in certain sections so that the distance between actuating electrode and sensor electrode is variable during deformation of the cover in the region of the actuating surface. The arrangement also includes a control and evaluation device which is coupled at least to the sensor electrode to detect a capacitance between sensor electrode and actuating electrode.

16 Claims, 2 Drawing Sheets

(51) Int. Cl.
*E05B 81/78* (2014.01)
*E05B 81/76* (2014.01)
*H03K 17/96* (2006.01)
*H03K 17/975* (2006.01)
*E05C 19/00* (2006.01)
*E05B 85/16* (2014.01)

(52) U.S. Cl.
CPC ............ *H03K 17/962* (2013.01); *H03K 17/975* (2013.01); *E05B 85/16* (2013.01); *Y10T 292/57* (2015.04)

(56) References Cited

U.S. PATENT DOCUMENTS

| | | | | |
|---|---|---|---|---|
| 4,453,061 | A * | 6/1984 | Tamura | H01H 9/047 200/302.2 |
| 4,456,798 | A * | 6/1984 | Iwai | H01H 13/702 200/306 |
| 4,490,587 | A * | 12/1984 | Miller | H01H 13/702 200/5 A |
| 4,508,942 | A * | 4/1985 | Inaba | H01H 13/702 200/306 |
| 4,641,004 | A * | 2/1987 | Keprda | H01H 13/70 200/302.2 |
| 4,677,268 | A * | 6/1987 | Nemeth | H01H 13/702 200/513 |
| 4,716,262 | A * | 12/1987 | Morse | H01H 13/702 200/302.1 |
| 4,794,215 | A * | 12/1988 | Sawada | H01H 13/06 200/302.2 |
| 4,851,626 | A * | 7/1989 | Nagashima | H01H 13/52 200/513 |
| 5,258,592 | A * | 11/1993 | Nishikawa | H01H 13/52 200/302.2 |
| 6,075,294 | A * | 6/2000 | Van den Boom et al. | 307/10.1 |
| 6,600,120 | B1 * | 7/2003 | Marmaropoulos | H01H 13/702 200/306 |
| 6,657,537 | B1 * | 12/2003 | Hauler | 340/5.62 |
| 6,768,413 | B1 * | 7/2004 | Kemmann et al. | 340/5.72 |
| 6,963,039 | B1 * | 11/2005 | Weng | H01H 23/06 200/302.1 |
| 7,057,124 | B2 * | 6/2006 | Ieda et al. | 200/61.62 |
| 7,091,823 | B2 * | 8/2006 | Ieda et al. | 340/5.72 |
| 7,126,453 | B2 * | 10/2006 | Sandau et al. | 340/5.61 |
| 7,199,317 | B2 * | 4/2007 | Ieda et al. | 200/61.62 |
| 7,273,991 | B2 * | 9/2007 | Korultay | E05B 81/76 200/520 |
| 7,445,257 | B2 * | 11/2008 | Muller et al. | 292/336.3 |
| 7,557,322 | B2 * | 7/2009 | Adachi | H01H 1/40 200/558 |
| 7,569,786 | B2 * | 8/2009 | Spies | H01H 3/122 200/339 |
| 7,654,147 | B2 * | 2/2010 | Witte et al. | 73/781 |
| 7,705,255 | B2 * | 4/2010 | Yokote | H01H 13/06 200/302.2 |
| 7,931,314 | B2 * | 4/2011 | Nitawaki et al. | 292/336.3 |
| 8,042,845 | B2 * | 10/2011 | Tanimoto et al. | 292/336.3 |
| 8,333,492 | B2 * | 12/2012 | Dingman et al. | 362/501 |
| 8,454,062 | B2 * | 6/2013 | Rohlfing et al. | 292/336.3 |
| 8,502,099 | B2 * | 8/2013 | Lin | H01H 1/64 200/302.2 |
| 8,636,309 | B2 * | 1/2014 | Muller et al. | 292/336.3 |
| 2002/0005016 | A1 | 1/2002 | Menke | |
| 2003/0029210 | A1 * | 2/2003 | Budzynski et al. | 70/278.1 |
| 2003/0107473 | A1 * | 6/2003 | Pang et al. | 340/5.72 |
| 2004/0217601 | A1 * | 11/2004 | Garnault et al. | 292/336.3 |
| 2004/0257296 | A1 * | 12/2004 | Ieda et al. | 343/872 |
| 2005/0006909 | A1 * | 1/2005 | Tanimoto et al. | 292/201 |
| 2005/0212308 | A1 * | 9/2005 | Makino et al. | 292/336.3 |
| 2007/0046080 | A1 * | 3/2007 | Muneta | 297/184.13 |
| 2007/0115191 | A1 * | 5/2007 | Hashiguchi et al. | 343/713 |
| 2012/0133563 | A1 * | 5/2012 | Naka | 343/713 |
| 2012/0326566 | A1 * | 12/2012 | Koyama et al. | 310/338 |
| 2014/0246873 | A1 * | 9/2014 | Raulin et al. | 292/336.3 |
| 2015/0091311 | A1 * | 4/2015 | Witte et al. | 292/336.3 |

FOREIGN PATENT DOCUMENTS

| | | | | |
|---|---|---|---|---|
| DE | 102008032820 | A1 * | 1/2010 | E05B 65/20 |
| EP | 1167666 | A1 | 1/2002 | |
| EP | 1398434 | A2 * | 3/2004 | E05B 1/00 |
| EP | 1674641 | A1 * | 6/2006 | |
| EP | 1840845 | A2 * | 10/2007 | G07C 9/00 |
| EP | 2053744 | A2 * | 4/2009 | H03K 17/955 |
| EP | 2088267 | A2 * | 8/2009 | E05B 65/20 |
| FR | 2904889 | A1 * | 2/2008 | H01H 13/48 |
| FR | 2915796 | A1 * | 11/2008 | G01D 3/028 |
| FR | 2927108 | A1 * | 8/2009 | E05B 65/20 |
| WO | 0140607 | A1 | 6/2001 | |
| WO | WO 2005029639 | A1 * | 3/2005 | H01Q 1/32 |
| WO | WO 2006015631 | A1 * | 2/2006 | E05B 65/20 |
| WO | WO 2007071516 | A1 * | 6/2007 | H03K 17/96 |
| WO | WO 2009112310 | A1 * | 9/2009 | E05B 65/20 |
| WO | 2011130755 | A2 | 10/2011 | |

OTHER PUBLICATIONS

Microchip Technology Inc., AN1325, mTouch Metal Over Cap Technology, Copyright 2010, Microchip Technology Incorporated, 8 pages.

Microchip Technology Inc., AN1626, Implementing Metal Over Capacitive Touch Sensors, Copyright 2013, Microchip Technology Incorporated, 18 pages.

* cited by examiner

DOOR HANDLE ARRANGEMENT FOR VEHICLES

CROSS-REFERENCE TO RELATED APPLICATION

This application claims the benefit of U.S. provisional patent application Ser. No. 61/834,243 filed on Jun. 12, 2013, the contents of which are incorporated by reference for all purposes as if set forth in their entirety herein.

BACKGROUND

The invention relates to a door handle arrangement for vehicles. In particular, the invention relates to a door handle arrangement for vehicles which uses a capacitive touch sensor which is actuated by application of pressure to an actuating surface.

Pressure-sensitive capacitive detection devices are known in the prior art. For example, WO 2011/130755 A2 discloses a capacitive detection device. In this detection device, a sensor surface is brought into the vicinity of a metal cover. By pressing on the metal cover the distance between cover and sensor surface can be varied and the variable capacitance is detected.

The document US 2012/0326566 A1 also discloses a capacitive sensor. An excitation electrode is disposed above a fixed electrode and an oscillating circuit is connected to the capacitance thus formed. The detuning of the oscillating circuit is detected as a measure for the change in the capacitance.

In motor vehicles, capacitive sensors for detecting user actuations are primarily known as proximity sensors which detect a mere approach of a body part of a user into the proximity of the sensor. Contact is not necessary with these sensors. For example, such capacitive proximity sensors are disposed in the door handles of vehicles in order to sense the approach of a user for so-called keyless entry systems. The approaching user changes the environment (the surrounding dielectric) of an electrode disposed in the door handle and thus changes the capacitance between this electrode and a reference. In addition, the capacitance of the user himself has effects on the capacitance system of the sensor being studied.

Touch sensors which respond to buttons or pressure are frequently realized by means of mechanical contact switches in vehicles.

One problem with capacitive proximity sensors is that environmental influences significantly affect the sensitivity of the arrangement and also erroneous detections. Other environmental influences such as snow, rain or air humidity lead to erroneous detections. In addition, the external shape of the vehicle cannot be selected arbitrarily in the sensor area. In particular, coatings, e.g. chrome parts inhibit sensing in the outer area if the sensing electrode area is substantially covered by a metal layer. Mechanical contact switches in turn perturb the appearance and are expensive to seal to keep environmental influences away from the interior of a vehicle handle.

SUMMARY

It is the object of the invention to provide an improved actuating switch for motor vehicles which reliably and sensitively senses the pressure actuation by a user.

The object is solved according to the invention by a door handle arrangement having the features of claim 1.

According to the invention, the door handle arrangement is configured such that a mechanically stable, electrically insulating cover is provided on the handle. An outer actuating surface for a user is provided on or in the handle cover. The actuating surface can be set back visually from the rest of the cover or can have a haptic offset. However, it can also be formed in the same way as the surrounding cover, away from the actuating surface. This actuating surface is the region on which the user must apply a pressure in order to perform an actuating action. The cover is electrically insulating, for example, formed from a plastic material.

An actuating electrode is disposed on the inner side of the cover, i.e. on the side of the cover which is not accessible to the user. During an actuation, accordingly the electrically insulating material is always located between the actuating user and the actuating electrode. The cover is elastically deformable by an actuation in the area of the actuating surface. The elastic deformability is determined by the material of which the cover is formed, in any case in the region of the actuating surface. For example, a stable plastic material (acrylonitrile butadiene styrene copolymerisate—ABS for short) can be provided as the cover, which barely deforms noticeably when the user applies pressure for this. In this small deformation region, which for example is only a few tenths of a millimeter or less, an elastic back deformation is ensured after removal of pressure from the actuating surface. The actuating electrode, which is disposed on the inner side of the cover, is deflected or likewise deformed during the deformation.

A sensor electrode is placed at a distance from the actuating electrode in the interior of the switching device, opposite the actuating elements which is disposed inside on the cover. The sensor electrode and the actuating electrode are located opposite one another at least in certain sections.

Since the actuating electrode is disposed on the inner side of the cover in the actuating region and the cover is deformable in this region, the actuating electrode is displaced or changed locally in another way during deformation of the cover in the region of the actuating surface. For example, the actuating electrode in this context can be disposed as a disk or small plate on the inner side of the deformable cover and move towards the sensor electrode during actuation of the cover. The essential thing is that during actuation and relevant deformation of the insulating cover, a change in spacing or at least a change in position takes place between the actuating electrode and sensor electrode.

A control and evaluation device is coupled at least to the sensor electrode to detect a capacitance between the sensor electrode and the actuating electrode. Methods for triggering an electrode to detect capacitance are known from the prior art. In particular, such circuits and methods are used in capacitive proximity sensors.

The control and evaluation circuit can detect a change in the capacitance of the sensor electrode with respect to a reference potential by periodically charging and discharging the sensor electrode with a predetermined frequency. The current or voltage profile of the charging process is evaluated to detect the change in capacitance. The parameter of a current or voltage profile dependent on the periodic charging and discharging of the sensor electrode can, for example, be a voltage which is measurable by means of a capacitor, which depends on the charge accumulated at the capacitor, where this charge is accumulated by periodically repeatedly charging the sensor electrode by connection to the operating voltage and then discharged via this by connection to the capacitor via this.

In addition, there are control and evaluation devices for capacitive evaluation such as, for example, "Charge Time Measurement Unit" such as the AN1250 from Microchip Technology Inc.

The door handle arrangement according to the invention has the advantage that no environmentally influenced region lies between the electrodes which form the measured capacitance. In particular, an electrically insulating material is formed as the boundary of the actuating device with respect to the exterior space and in particular the user. The device according to the invention allows any configuration of the switching device to be permitted. In particular, metal coatings, chrome platings and varnishings of any kind are possible. These only insignificantly influence the detection. External influences such as rain, snow and air humidity have no negative influences on the sensor device.

In a further development of the invention, the actuating electrode is applied as a metal layer to the inner side of the cover.

Such a layer can be configured as an adhesive film, as a spreadable coating, as a dip coating or as an electrochemically deposited coating.

The only important thing is that a flat electrode layer is formed which changes its position upon actuation and deformation of the cover in the actuating region.

In one embodiment of the invention, the outer side of the cover is provided with a metal coating.

This configuration is possible despite capacitive detection since the spacing of the actuating electrode and the sensor electrode in the interior of the door handle is detected. The external environment and the field line distribution in the outer region is not essential for this invention.

Despite capacitive detection, this enables novel and attractive shapes of door handles for vehicles.

In a further development of the invention, the actuating electrode and the outer metallic coating are in contact with one another or configured to be coincident.

It is possible to provide the outer coating, e.g. chrome plating, at the same time as the inner electrode configuration. If, for example, the cover of the door handle is completely chrome-plated on the inside and outside, a door handle arrangement according to the invention is also possible in this way.

The actuating electrode is preferably connected to the vehicle mass (ground).

In this way, a reproducible potential of the actuating electrode is ensured at any time. This improves the detection accuracy. In particular, when the actuating electrode is in contact with the metal outer coating, undesirable charge reversal effects can be avoided in this way.

In a preferred embodiment, the sensor electrode is disposed and contacted on a printed circuit board.

A printed circuit board with the sensor electrode can easily be fixed with respect to the actuating electrode in the door handle. To this end, receptacles and fixings for the printed circuit board can be provided in the handle body.

The sensor electrode can be applied as a copper surface during the manufacture of the printed circuit board, however it can also comprise a soldered-on component.

Preferably, on the side of the printed circuit board facing away from the sensor electrode, a reinforcing layer of a stiff material is brought in contact with the printed circuit board.

The reinforcing layer prevents any deformation of the printed circuit board during actuation. The reinforcing layer should be formed from a light and stiff material.

In a further embodiment, in order to prevent excessive deformation of the cover and damage to the components located underneath the cover, spacers are provided, which in certain sections delimit the minimal spacing between cover and sensor electrode.

The spacers which are disposed, for example, at the side of the sensor electrode ensure that deformation only occurs in the desired region, the actuating region.

In a preferred configuration of the door handle arrangement, the cover is formed integrally with the actuating surface.

Such an integral configuration simplifies the manufacture and ensures a complete seal in the actuating region. In this context, it is possible to vary the material thickness of the cover in the actuating region in order to enable a desired deformation in this region without however there being a risk of destruction.

These and still other advantages of the invention will be apparent from the detailed description and drawings. What follows is merely a description of some preferred embodiments of the present invention. To assess the full scope of the invention the claims should be looked to as these preferred embodiments are not intended to be the only embodiments within the scope of the claims.

BRIEF DESCRIPTION OF THE DRAWINGS

The invention is now explained in detail with reference to the appended figures.

DETAILED DESCRIPTION OF THE PREFERRED EMBODIMENTS

Figure 1A:
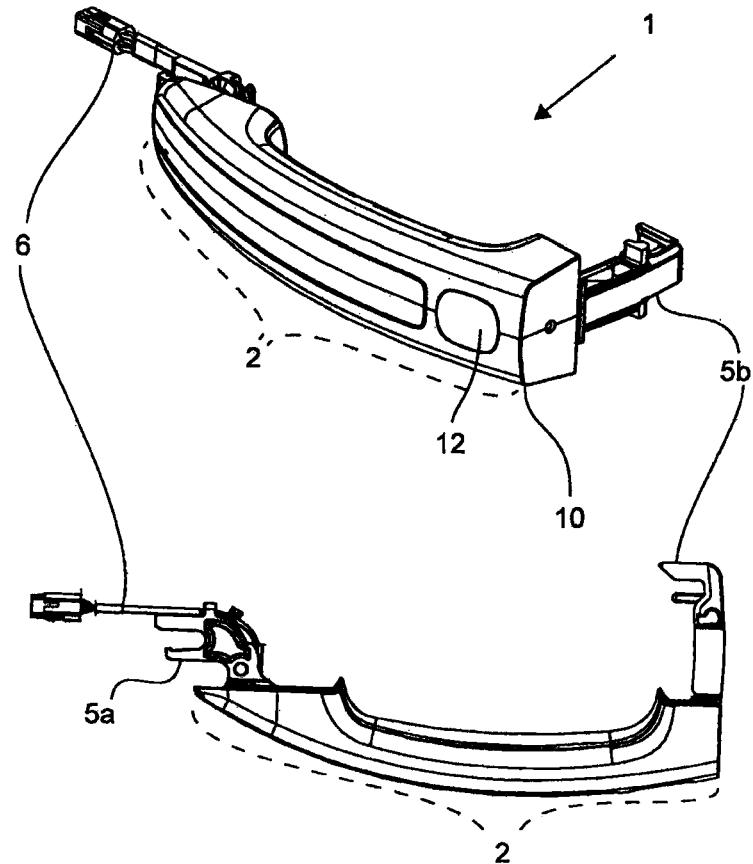
FIG. 1a shows a handle arrangement according to a first exemplary embodiment.

FIG. 1a shows a handle arrangements 1. The handle arrangement has a handle section 2 behind which a user can grip with his hand in order to open a door. Mechanical connecting means 5a, 5b are disposed at the ends of the handle arrangement. A cable strand 6 is disposed at one of the ends of the handle arrangement. The cable strand 6 is used for contacting the components located in the handle with the cable harness of the vehicle.

In the mounted state both the cable strand 6 and also the mechanical connecting means 5a, 5b are concealed in the door interior, behind the door panel so that from outside only the handle 2 of the door handle 1 remains accessible.

The region of the handle 2 facing outwards is formed by a cover 10. In this example, the cover 10 is formed from a plastic material with an exterior chrome-plating. The cover 10 has an offset actuating region 12 which for the user discernibly forms an accessible active region for actuation for the device according to the invention. This region is made identifiable, for example, by a circumferential protuberance in the chrome layer or a change in the surface configuration, for example a roughening or profiling of the cover and/or chrome layer. Additionally or alternatively, as in the example shown here, this region is made identifiable by a slight inward curvature as actuating surface.

Figure 1B:
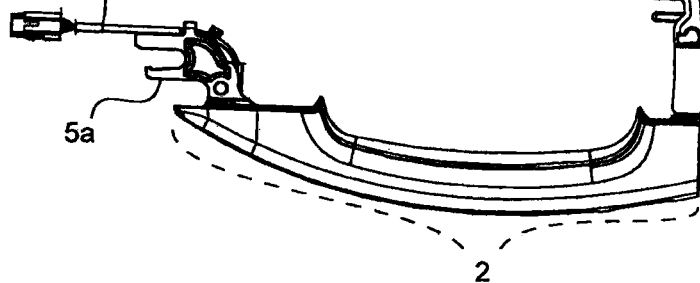
FIG. 1b shows the handle arrangement from FIG. 1a in a view from above.
Figure 1C:
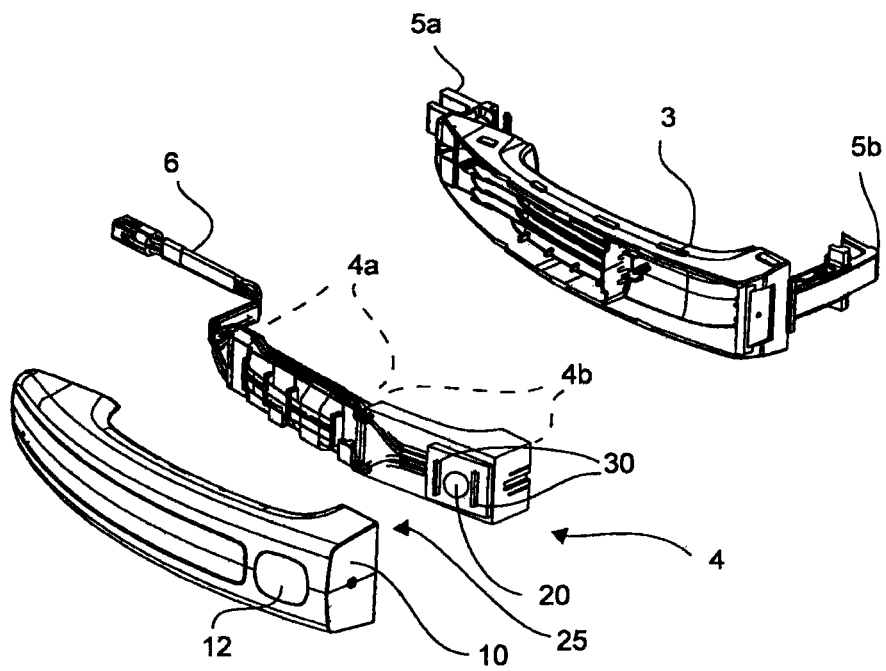
FIG. 1c shows the handle arrangement with a lifted-off cover in a first view.

FIG. 1c shows the handle arrangement from FIGS. 1a and 1b where the cover is removed from the substructure or body of the handle.

A body 3 and an assembly 4 are visible. The body 3 forms the component of the door handle arrangement subjected to the greatest mechanical loading and imparts the entire arrangement the necessary stability. In particular, the forces during actuation of the door opening and pivoting of the door are received and led away in the body.

In this embodiment, the assembly 4 comprises both components for a capacitive detection of approach (section 4a) and also the components for the capacitive button holder (section 4b). In addition, further components can be received in the assembly (e.g. antennae) which, however, are not relevant here.

In this exemplary embodiment it is accordingly provided that the door handle comprises both a capacitive proximity sensor (section 4a) and also a capacitive pressure sensor (section 4b). The components for the capacitive proximity sensor are disposed along the longitudinal extension offset to the components of the capacitive actuation sensor. Other arrangements and a dispensing with the proximity sensor so that only a capacitive pressure sensor is formed are however possible.

Figure 1D:
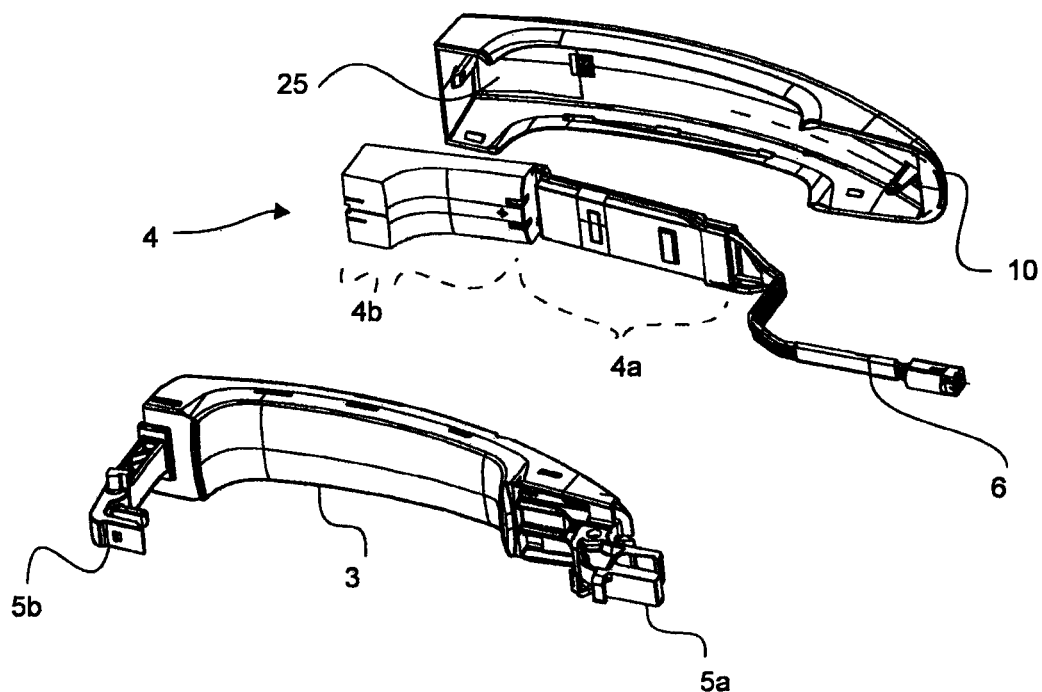
FIG. 1d shows the handle arrangement with a lifted-off cover in a second view.

FIG. 1d shows the arrangement according to FIG. 1c in another view.

In the handle body the device for detecting the deformation of the actuating surface 12 is disposed below the actuating surface 12.

A sensor electrode 20 is located below the cover and below the actuating surface 12 in the handle. The cover 10 is occupied from the inner side, at least in the region of the actuating surface 12 by a metal electrode 25, the actuating electrode. In this example, the actuating electrode 25 consists of a metal film coating which is applied to the inner side of the cover 10. In a modified configuration, however, the chrome plating applied to the handle on the outside can be applied in the same way to the inner side of the cover in order to form an internal electrode surface which is not exposed to environmental influences.

When a pressure is exerted on the actuating surface 12, the material of the cover 10 is easily deformed in this region so that the spacing of the sensor electrode 20 from the cover 10 bending thereover with actuating surface 12 changes. Since an actuating electrode 25 is formed on the inner side of the cover 10 in the region of the actuating surface 12, the spacing between this inner electrode surface 25 and the sensor electrode 20 changes. The change in spacing of the electrodes 20 and 25 results in a change in capacitance which can be detected by the electronics disposed in the handle (in section 4a). Even small deformations of the material of the cover 10 are sufficient to bring about a significant change in the capacitance.

Figure 2A:
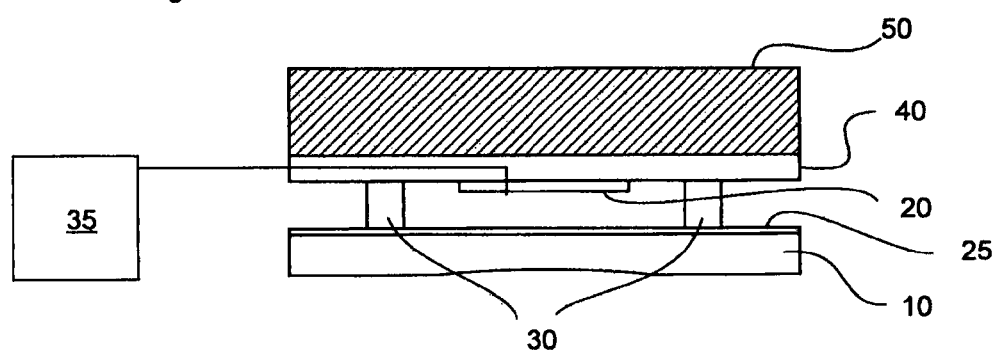
FIG. 2a shows an electrical schematic sectional view of the functional components of the actuating switch of the invention.

FIG. 2a shows a schematic enlargement of the actuating surface and the electrodes.

The side facing the user is the lower side of the page in the diagrams 2a and 2b. The cover is provided with the reference number 10, the indentation of the actuating surface 12 is also shown schematically. An electrode layer 25 is formed on the inner side of the cover 10. In addition, spacers 30 are provided which maintain a spacing between the cover 10 and the electrode 25 from the printed circuit board 40. On the printed circuit board 40 the electrode 20 is configured as a copper surface. A receptacle or reinforcing layer 50 is located below the printed circuit board 40. This reinforcing layer ensures that the printed circuit board is not deformed by transmission of force via the spacers 30 but the cover 10 together with the electrode 25 in the region where pressure is applied (12).

Figure 2B:
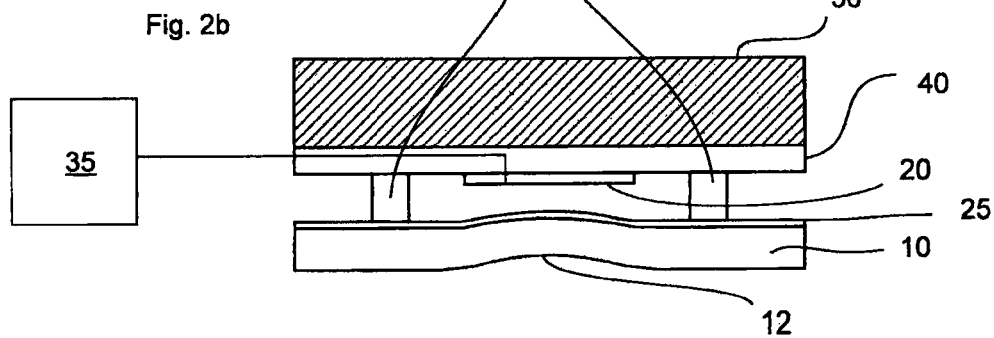
FIG. 2b shows the arrangement from FIG. 2a upon actuation and deformation by a user.

As FIG. 2b shows, when pressure is applied to the surface 12, the cover 10 with the electrode 25 is deformed in the direction of the sensor electrode 20 and approaches this. The capacitance between electrode 20 and electrode 25 changes. The electrode 20 is connected to a control and evaluation circuit 35 in order to detect this capacitance. As described above, to this end the electrode 20 is repeatedly connected to a potential which leads to a representative charge transfer for the capacitance between electrode 20 and electrode 25. After each charging, the electrode is discharged, the charge accumulated at the electrode being transferred to a storage capacitor. The actual capacitance can thus be detected in several cycles. Relative deviations in the time profile can thus be detected in this way. Within the framework of the invention however, any other types of capacitance determination or charge determination are possible for use with the electrode 20.

By reference to this description it is clear that only the deformation of the electrodes 25 and 20 with respect to one another is relevant for the detected change in capacitance. The processes on the outer side of the cover 10, for example, triggered by dust, rain or by contactless approaches are not detected. In addition, the outer side of the cover can easily be provided with conducting elements or adornments, in particular chrome adornments. Nevertheless the manufacture of the actuating device according to the invention is very simple since the cover merely needs to have a corresponding actuating region. No essential mechanical precautions, for example, sealed buttons or similar need be provided in this region. Due to the continuous fabrication of the cover, this is, as before, completely sealed to environmental influences.

It should be appreciated that various other modifications and variations to the preferred embodiments can be made within the spirit and scope of the invention. Therefore, the invention should not be limited to the described embodiments. To ascertain the full scope of the invention, the following claims should be referenced.

We claim:

1. A door handle arrangement for vehicles, comprising:
 a body;
 an electrically insulating cover connected to the body and having an outer actuating surface for a user and a metal actuating electrode including a metal layer coupled to an inner side of the actuating surface, the actuating surface being elastically deformable by an actuation in the area of the actuating surface,
 a sensor electrode disposed at a distance from the actuating electrode and opposite the inner side of the actuating surface, wherein the sensor electrode is disposed within the body of the door handle arrangement and lies opposite the actuating electrode so that the distance between actuating electrode and sensor electrode is variable during deformation of the cover in the region of the actuating surface,
 at least one static spacer disposed between the actuating electrode and the sensor electrode and configured to maintain a spacing between the actuating electrode and a substrate supporting the sensor electrode; and
 a control and evaluation device in communication with the sensor electrode to detect a capacitance between the sensor electrode and the actuating electrode.

2. The door handle arrangement according to claim 1, wherein the door handle arrangement is not adversely affected by external factors as the sensing field is internal to the door handle.

3. The door handle arrangement according to claim 1, whereby a capacitive sensing activation field is interior to the door handle.

4. The door handle arrangement according to claim 1, wherein the actuating electrode is configured as an adhesive film.

5. The door handle arrangement according to claim 1, wherein the actuating electrode is configured as a spreadable coating.

6. The door handle arrangement according to claim 5, wherein the actuating electrode and an outer metallic coating are in contact with one another or configured to be continuous.

7. The door handle arrangement according to claim 1, wherein the actuating electrode is configured as a dip coating.

8. The door handle arrangement according to claim 1, wherein the actuating electrode is configured as a electrochemical deposited coating.

9. The door handle arrangement according to claim 1, wherein the substrate is a printed circuit board.

10. The door handle arrangement according to claim 9, wherein on the side of the printed circuit board facing away from the sensor electrode, a reinforcing layer of a stiff material is brought in contact with the printed circuit board, in order to prevent deformation of the printed circuit board during actuation.

11. The door handle arrangement according to claim 1, wherein the at least one spacer in certain sections delimits the minimal spacing between the cover and the sensor electrode.

12. The door handle arrangement according to claim 1, wherein the outer side of the cover is provided with a metal coating.

13. The door handle arrangement according to claim 1, wherein the actuating electrode is connected to a vehicle mass providing a ground.

14. The door handle arrangement according to claim 1, wherein the cover is configured integrally with the actuating surface.

15. The door handle arrangement according to claim 1, wherein the sensor electrode is rigidly coupled to the body of the door handle arrangement.

16. The door handle arrangement according to claim 1, wherein the at least one spacer includes a first spacer disposed on a first side of the sensor electrode and a second spacer disposed on a second side of the sensor electrode, the first side being opposite the second side.

* * * * *